US009660191B2

(12) United States Patent
Lee et al.

(10) Patent No.: US 9,660,191 B2
(45) Date of Patent: May 23, 2017

(54) THIN FILM DEPOSITION APPARATUS AND METHOD OF MANUFACTURING ORGANIC LIGHT-EMITTING DISPLAY DEVICE BY USING THE SAME

(71) Applicant: SAMSUNG DISPLAY CO., LTD., Yongin, Gyeonggi-Do (KR)

(72) Inventors: Choong-Ho Lee, Yongin (KR); Jung-Min Lee, Yongin (KR); Jun-Sik Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 272 days.

(21) Appl. No.: 14/617,861

(22) Filed: Feb. 9, 2015

(65) Prior Publication Data

US 2015/0155489 A1  Jun. 4, 2015

Related U.S. Application Data

(62) Division of application No. 12/950,361, filed on Nov. 19, 2010, now Pat. No. 8,951,349.

(30) Foreign Application Priority Data

Nov. 20, 2009  (KR) .......................... 10-2009-0112796

(51) Int. Cl.
*C23C 14/24* (2006.01)
*C23C 14/26* (2006.01)
(Continued)

(52) U.S. Cl.
CPC .......... *H01L 51/001* (2013.01); *C23C 14/042* (2013.01); *C23C 14/12* (2013.01);
(Continued)

(58) Field of Classification Search
CPC ................. C23C 14/24–14/325; C23C 16/455
(Continued)

(56) References Cited

U.S. PATENT DOCUMENTS 3,989,004 A * 11/1976 Scholes ................. C03C 17/005
118/732
4,011,157 A * 3/1977 Pennebaker, Jr. ...... B01D 43/00
101/366
(Continued)

FOREIGN PATENT DOCUMENTS

EP   1 413 644 A2   4/2004
EP   1 418 250 A2   5/2004
(Continued)

OTHER PUBLICATIONS

KIPO Office action dated Jan. 6, 2012, for Korean Patent application 10-2010-0000897, (4 pages).
(Continued)

*Primary Examiner* — Gordon R Baldwin
*Assistant Examiner* — Aiden Lee
(74) *Attorney, Agent, or Firm* — Lewis Roca Rothgerber Christie LLP

(57) ABSTRACT

A thin film deposition apparatus including a deposition source having a crucible to contain a deposition material and a heater to heat and vaporize the deposition material; a nozzle unit disposed at a side of the deposition source along a first direction and having a plurality of nozzle slits to discharge the deposition material that was vaporized; a plurality of emission coefficient increasing units disposed toward the nozzle unit within the deposition source and increasing a quantity of motion of the deposition material that is discharged toward the nozzle unit; a patterning slit sheet disposed opposite to the nozzle unit and having a plurality of patterning slits arranged along the first direction;
(Continued)

and a barrier plate assembly disposed between the nozzle unit and the patterning slit sheet along the first direction, and having a plurality of barrier plates that partition a space between the nozzle unit and the patterning slit sheet into a plurality of sub-deposition spaces.

9 Claims, 7 Drawing Sheets

(51) Int. Cl.
| | | |
|---|---|---|
| C23C 16/455 | (2006.01) | |
| H01L 51/00 | (2006.01) | |
| C23C 14/04 | (2006.01) | |
| C23C 14/12 | (2006.01) | |
| H01L 51/56 | (2006.01) | |
| H05B 33/10 | (2006.01) | |
| C23C 16/46 | (2006.01) | |
| H01L 51/50 | (2006.01) | |

(52) U.S. Cl.
CPC ............ *C23C 14/24* (2013.01); *C23C 14/243* (2013.01); *C23C 14/246* (2013.01); *C23C 14/26* (2013.01); *C23C 16/455* (2013.01); *C23C 16/46* (2013.01); *H01L 51/0008* (2013.01); *H01L 51/56* (2013.01); *H05B 33/10* (2013.01); *H01L 51/5012* (2013.01)

(58) Field of Classification Search
USPC ................................................ 118/726–727
See application file for complete search history.

(56) References Cited

U.S. PATENT DOCUMENTS

| | | | |
|---|---|---|---|
| 5,454,847 A | 10/1995 | Jacoboni et al. | |
| 5,584,903 A * | 12/1996 | Guthrie ............... | B05B 15/1222 118/720 |
| 5,792,519 A * | 8/1998 | Bergmann ............. | C23C 14/02 427/248.1 |
| 5,795,399 A | 8/1998 | Hasegawa et al. | |
| 6,099,649 A | 8/2000 | Schmitt et al. | |
| 6,214,110 B1 | 4/2001 | Powell | |
| 6,274,198 B1 | 8/2001 | Dautartas | |
| 6,371,451 B1 | 4/2002 | Choi | |
| 6,554,969 B1 | 4/2003 | Chong | |
| 6,749,906 B2 | 6/2004 | Van Slyke | |
| 7,322,248 B1 | 1/2008 | Long | |
| 2001/0006827 A1 | 7/2001 | Yamazaki et al. | |
| 2002/0076847 A1 | 6/2002 | Yamada et al. | |
| 2002/0168577 A1 | 11/2002 | Yoon | |
| 2003/0101937 A1 | 6/2003 | Van Slyke et al. | |
| 2003/0138684 A1* | 7/2003 | Tinker .................... | H01M 2/10 429/403 |
| 2003/0168013 A1 | 9/2003 | Freeman et al. | |
| 2003/0221614 A1 | 12/2003 | Kang et al. | |
| 2003/0232563 A1 | 12/2003 | Kamiyama et al. | |
| 2004/0016907 A1 | 1/2004 | Shi | |
| 2004/0115338 A1 | 6/2004 | Yoneda | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0194702 A1 | 10/2004 | Sasaki et al. | |
| 2005/0001546 A1 | 1/2005 | Yamaguchi | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0039684 A1 | 2/2005 | Yi et al. | |
| 2005/0072361 A1 | 4/2005 | Yang et al. | |
| 2005/0166842 A1 | 8/2005 | Sakamoto | |
| 2005/0217584 A1 | 10/2005 | Abiko et al. | |
| 2005/0263074 A1 | 12/2005 | Masuda et al. | |
| 2006/0011136 A1 | 1/2006 | Yamazaki et al. |
| 2006/0144325 A1 | 7/2006 | Jung et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2007/0077358 A1 | 4/2007 | Jeong et al. |
| 2007/0148348 A1 | 6/2007 | Huh et al. |
| 2007/0178708 A1 | 8/2007 | Ukigaya |
| 2007/0195844 A1 | 8/2007 | Ma et al. |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2008/0277103 A1 | 11/2008 | Yamada et al. |
| 2009/0017192 A1 | 1/2009 | Matsuura |
| 2009/0124033 A1 | 5/2009 | Moriyama |
| 2009/0133629 A1 | 5/2009 | Kamikawa et al. |
| 2009/0229524 A1 | 9/2009 | Kim et al. |
| 2009/0232976 A1 | 9/2009 | Yoon et al. |
| 2009/0304906 A1 | 12/2009 | Suduo et al. |
| 2010/0170439 A1 | 7/2010 | Negishi |
| 2010/0255198 A1 | 10/2010 | Cleary et al. |
| 2010/0271775 A1 | 10/2010 | Bult et al. |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0307409 A1 | 12/2010 | Lee et al. |
| 2010/0310759 A1 | 12/2010 | Lee et al. |
| 2010/0310768 A1 | 12/2010 | Lee et al. |
| 2010/0316801 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0033964 A1 | 2/2011 | Oh et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0053301 A1 | 3/2011 | Kang et al. |
| 2011/0088622 A1 | 4/2011 | Choi et al. |
| 2011/0165320 A1 | 7/2011 | Choi et al. |
| 2011/0165327 A1 | 7/2011 | Park et al. |
| 2011/0168986 A1 | 7/2011 | Lee et al. |
| 2011/0186820 A1 | 8/2011 | Kim et al. |
| 2011/0220022 A1 | 9/2011 | Hong et al. |
| 2011/0244120 A1 | 10/2011 | Choi et al. |
| 2012/0174865 A1 | 7/2012 | Choi et al. |

FOREIGN PATENT DOCUMENTS

| | | |
|---|---|---|
| EP | 1 518 940 A1 | 3/2005 |
| JP | 04-272170 | 9/1992 |
| JP | 05-098425 | 4/1993 |
| JP | 2000-068054 A | 3/2000 |
| JP | 2001-052862 A | 2/2001 |
| JP | 2001-093667 A | 4/2001 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-297562 A | 10/2003 |
| JP | 2004-043898 A | 2/2004 |
| JP | 2004-103269 A | 4/2004 |
| JP | 2004-107764 | 4/2004 |
| JP | 2004-199919 A | 7/2004 |
| JP | 2004-349101 | 12/2004 |
| JP | 2005-044592 A | 2/2005 |
| JP | 2005-235568 A | 9/2005 |
| JP | 2005-293968 A | 10/2005 |
| JP | 2005-296737 A | 10/2005 |
| JP | 2006-275433 A | 10/2006 |
| JP | 2007-047293 A | 2/2007 |
| JP | 2008-121098 A | 5/2008 |

(56) References Cited

FOREIGN PATENT DOCUMENTS

| | | |
|---|---|---|
| JP | 2008-248301 | 10/2008 |
| JP | 2009-019243 A | 1/2009 |
| JP | 2009-087910 A | 4/2009 |
| JP | 2004-091858 | 3/2014 |
| KR | 10-0257219 B1 | 2/2000 |
| KR | 10-2000-0019254 A | 4/2000 |
| KR | 10-2000-0023929 A | 5/2000 |
| KR | 10-2001-0059939 A | 7/2001 |
| KR | 10-2002-0000201 A | 1/2002 |
| KR | 10-2002-0050922 A | 6/2002 |
| KR | 10-2002-0090934 A | 12/2002 |
| KR | 10-0405080 | 11/2003 |
| KR | 10-2003-0091947 A | 12/2003 |
| KR | 10-2003-0093959 A | 12/2003 |
| KR | 20-0342433 Y | 2/2004 |
| KR | 10-2004-0034537 | 4/2004 |
| KR | 2004-0050045 A | 6/2004 |
| KR | 2004-0069281 A | 8/2004 |
| KR | 10-2004-0084747 A | 10/2004 |
| KR | 10-2004-0110718 | 12/2004 |
| KR | 10-0463212 | 12/2004 |
| KR | 10-2005-0018234 | 2/2005 |
| KR | 10-2005-0028943 | 3/2005 |
| KR | 10-2005-0039140 | 4/2005 |
| KR | 10-0520159 | 10/2005 |
| KR | 10-0532657 B1 | 12/2005 |
| KR | 10-2006-0008602 | 1/2006 |
| KR | 10-2006-0018745 A | 3/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0081943 | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109561 | 10/2006 |
| KR | 10-2006-0109627 A | 10/2006 |
| KR | 10-0646160 | 11/2006 |
| KR | 10-0687007 | 2/2007 |
| KR | 10-2007-0025164 A | 3/2007 |
| KR | 10-0696547 B1 | 3/2007 |
| KR | 10-0698033 | 3/2007 |
| KR | 10-0700466 | 3/2007 |
| KR | 10-2007-0035796 A | 4/2007 |
| KR | 10-0711885 | 4/2007 |
| KR | 10-2007-0050793 A | 5/2007 |
| KR | 10-0723627 B1 | 5/2007 |
| KR | 10-0726132 | 6/2007 |
| KR | 10-2007-0078713 A | 8/2007 |
| KR | 10-2007-0080635 A | 8/2007 |
| KR | 10-2007-0098122 | 10/2007 |
| KR | 10-2007-0101842 A | 10/2007 |
| KR | 10-2007-0105595 A | 10/2007 |
| KR | 10-0770653 B1 | 10/2007 |
| KR | 10-2007-0114094 | 11/2007 |
| KR | 10-2008-0001184 A | 1/2008 |
| KR | 10-2008-0003720 | 1/2008 |
| KR | 10-0797787 | 1/2008 |
| KR | 10-0800125 | 1/2008 |
| KR | 10-0815265 | 3/2008 |
| KR | 10-0823508 B1 | 4/2008 |
| KR | 10-2008-0044775 | 5/2008 |
| KR | 10-0827760 | 5/2008 |
| KR | 10-0839380 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2009-0038733 A | 4/2009 |
| KR | 10-2009-0047953 | 5/2009 |
| KR | 10-2009-0052828 | 5/2009 |
| KR | 10-2009-0097453 | 9/2009 |
| KR | 10-2010-0119368 | 11/2010 |
| KR | 10-2010-0126125 A | 12/2010 |
| KR | 10-2010-0130786 | 12/2010 |
| KR | 10-2010-0133678 | 12/2010 |
| KR | 10-2011-0022512 | 3/2011 |
| KR | 10-2011-0082418 | 7/2011 |
| KR | 10-2012-0081811 | 7/2012 |

OTHER PUBLICATIONS

KIPO Office Action dated Mar. 21, 2012, for Korean Patent application 10-2010-0065465, (5 pages).
KIPO Office Action dated Apr. 4, 2012, for Korean Patent application 10-2009-0112796, (5 pages).
KIPO Registration Determination Certificate dated Jul. 20, 2012, for Korean Patent application 10-2010-0000897, (5 pages).
U.S. Office action dated May 16, 2013, for cross reference U.S. Appl. No. 13/235,337, (28 pages).
U.S. Office action dated Apr. 29, 2013, for cross reference U.S. Appl. No. 12/820,355, (31 pages).
U.S. Office action dated Aug. 21, 2013, for cross reference U.S. Appl. No. 12/820,355, (14 pages).
English machine translation of Japanese Publication 2004-107764, dated Apr. 8, 2004, (10 pages).
Patent Abstracts of Japan, and English machine translation of Japanese Publication 2001-052862 dated Feb. 23, 2001, (20 pages).
Patent Abstracts of Japan, and English machine translation of Japanese Publication 2003-003250 dated Jan. 8, 2003, (25 pages).
Patent Abstracts of Japan, and English machine translation of Japanese Publication 2004-349101 dated Dec. 9, 2004, (11 pages).
Korean Patent Abstracts for Publication No. 10-2004-0043360, dated May 24, 2004, corresponding to KR Patent 10-0532657.
Korean Patent Abstracts, Publication No. 10-2002-0088662, dated Nov. 29, 2002, for corresponding Korean Patent No. 10-0463212, (2 pages).
Korean Patent Abstracts, Publication No. 10-2005-0045619, dated May 17, 2005, for corresponding Korean Patent No. 10-0520159, (2 pages).
Korean Patent Abstracts, Publication No. 10-2002-0056238, dated Jul. 10, 2001, for corresponding Korean Patent No. 10-0698033, (2 pages).
Korean Patent Abstracts, Publication No. 10-2002-0034272, dated May 9, 2002, for corresponding Korean Patent No. 10-0726132, (2 pages).
Korean Patent Abstracts, Publication No. 10-2006-0126267, dated Dec. 7, 2006, for corresponding Korean Patent No. 10-0797787, (2 pages).
Korean Patent Abstracts, Publication No. 10-2008-0038650, dated May 7, 2008, for corresponding Korean Patent No. 10-0839380, (2 pages).

* cited by examiner

THIN FILM DEPOSITION APPARATUS AND METHOD OF MANUFACTURING ORGANIC LIGHT-EMITTING DISPLAY DEVICE BY USING THE SAME

CROSS-REFERENCE TO RELATED APPLICATION

This application is a divisional of U.S. patent application Ser. No. 12/950,361, filed Nov. 19, 2010, which claims priority to and the benefit of Korean Patent Application No. 10-2009-0112796, filed Nov. 20, 2009 in the Korean Intellectual Property Office, the entire content of both of which are incorporated herein in-their entirety by reference.

BACKGROUND

1. Field

An aspect of the present invention relates to a thin film deposition apparatus and a method of manufacturing an organic light-emitting display device by using the same, and more particularly, to a thin film deposition apparatus that can be easily used to manufacture large-sized display devices on a mass scale and that can maximize the ratio of material utilization, and a method of manufacturing an organic light-emitting display device by using the thin film deposition apparatus.

2. Description of the Related Art

Organic light-emitting display devices have a larger viewing angle, better contrast characteristics, and a faster response rate than other display devices, and thus have drawn attention as a next-generation display device.

Organic light-emitting display devices generally have a stacked structure including an anode, a cathode, and an emission layer interposed between the anode and the cathode, so that a color image may be displayed when holes and electrons, injected respectively from the anode and the cathode, recombine in the emission layer and thus light is emitted. However, it is difficult to achieve high light-emission efficiency such a structure, and thus intermediate layers, including an electron injection layer, an electron transport layer, a hole transport layer, a hole injection layer, etc., are optionally additionally interposed between the emission layer and each of the electrodes.

Also, it is practically very difficult to form fine patterns in organic thin films such as the emission layer and the intermediate layers, and red, green, and blue light-emission efficiency varies according to the organic thin films. For these reasons, it is not easy to form an organic thin film pattern on a large substrate, such as a mother glass having a size of 5G or more, by using a conventional thin film deposition apparatus, and thus it is difficult to manufacture large organic light-emitting display devices having satisfactory driving voltage, current density, brightness, color purity, light-emission efficiency, life-span characteristics. Thus, there is a demand for improvement in this regard.

An organic light-emitting display device includes intermediate layers, including an emission layer disposed between a first electrode and a second electrode that are arranged opposite to each other. The intermediate layers and the first and second electrodes may be formed using a variety of methods, one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having a desired pattern.

SUMMARY

An aspect of the present invention provides a thin film deposition apparatus that can be easily used to manufacture large-sized display devices on a mass scale and that can maximize the ratio of material utilization, and a method of manufacturing an organic light-emitting display device by using the thin film deposition apparatus.

According to an aspect of the present invention, there is provided a thin film deposition apparatus including a deposition source having a crucible to contain a deposition material and a heater; a nozzle unit disposed at a side of the deposition source along a first direction and having a plurality of nozzle slits to discharge the deposition material that has been vaporized; a plurality of emission coefficient increasing units disposed toward the nozzle unit within the deposition source and increasing a quantity of motion of the deposition material that is discharged toward the nozzle unit; a patterning slit sheet disposed opposite to the nozzle unit and having a plurality of patterning slits arranged along the first direction; and a barrier plate assembly disposed between the nozzle unit and the patterning slit sheet along the first direction, and having a plurality of barrier plates that partition a space between the nozzle unit and the patterning slit sheet into a plurality of sub-deposition spaces.

The plurality of emission coefficient increasing units may be disposed on locations corresponding to the plurality of nozzle slits along the first direction, respectively.

The emission coefficient increasing units may include piezo-oscillation plates.

The piezo-oscillation plates may be perpendicular to the first direction and oscillate in a direction parallel to the nozzle unit.

Central axes of oscillation of the piezo-oscillation plates may substantially coincide with centers of the plurality of nozzle slits, respectively.

The piezo-oscillation plates may oscillate at a speed of about 0.2 to 4 times a speed of molecular motion of the heated deposition material.

Each of the emission coefficient increasing units may include a super-high speed rotary wing assembly.

A rotation axis of the super-high speed rotary wing assembly may be perpendicular to the first direction and a direction toward the nozzle unit.

A speed of rotation of the super-high rotary wing assembly may be about 0.2 to 4 times a speed of molecular motion of the heated deposition material.

The thin film deposition apparatus may further include a cooling unit disposed adjacent to the crucible.

The plurality of barrier plates may be arranged at equal intervals.

The plurality of barrier plates may be separated apart from the patterning slit sheet.

The barrier plate assembly may include a first barrier plate assembly including a plurality of first barrier plates, and a second barrier plate assembly including a plurality of second barrier plates.

The plurality of first and second barrier plates may be disposed along a second direction substantially perpendicular to the first direction, in order to partition the space between the nozzle unit and the patterning slit sheet into the plurality of sub-deposition spaces.

The first barrier plates may be arranged to correspond to the second barrier plates, respectively.

Each pair of the corresponding first and second barrier plates may be arranged on substantially the same plane.

According to another aspect of the present invention, there is provided a method of manufacturing an organic light emitting display device, the method including performing deposition on a substrate by disposing a thin film deposition apparatus to be separated apart from the substrate. The thin film deposition apparatus includes a deposition source having a crucible to contain a deposition material and a heater; a nozzle unit disposed at a side of the deposition source along a first direction and having a plurality of nozzle slits to discharge the deposition material that has been vaporized; a plurality of emission coefficient increasing units disposed between the crucible and the nozzle unit within the deposition source and increasing a quantity of motion of the deposition material that is discharged toward the nozzle unit; a patterning slit sheet disposed opposite to the nozzle unit and having a plurality of patterning slits arranged along the first direction; and a barrier plate assembly disposed between the nozzle unit and the patterning slit sheet along the first direction, and having a plurality of barrier plates that partition a space between the nozzle unit and the patterning slit sheet into a plurality of sub-deposition spaces.

The deposition may be performed while the thin film deposition apparatus and the substrate move relative to each other along a direction perpendicular to the first direction.

The emission coefficient increasing units may include a plurality of piezo-oscillation plates disposed an locations corresponding to the plurality of nozzle slits along the first direction, respectively. The deposition may be performed while a quantity of motion of the deposition material toward the nozzle unit is increased by using oscillation of the piezo-oscillation plates.

The emission coefficient increasing units may include super-high rotary wing assemblies disposed on locations corresponding to the plurality of nozzle slits along the first direction, respectively. The deposition may be performed while a quantity of motion of the deposition material toward the nozzle unit is increased by using rotation of the super-high rotary wing assemblies.

The deposition may be performed within a chamber that is maintained at an appropriate degree of vacuum.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments; taken in conjunction with the accompanying drawings of which.

DETAILED DESCRIPTION

Figure 1:
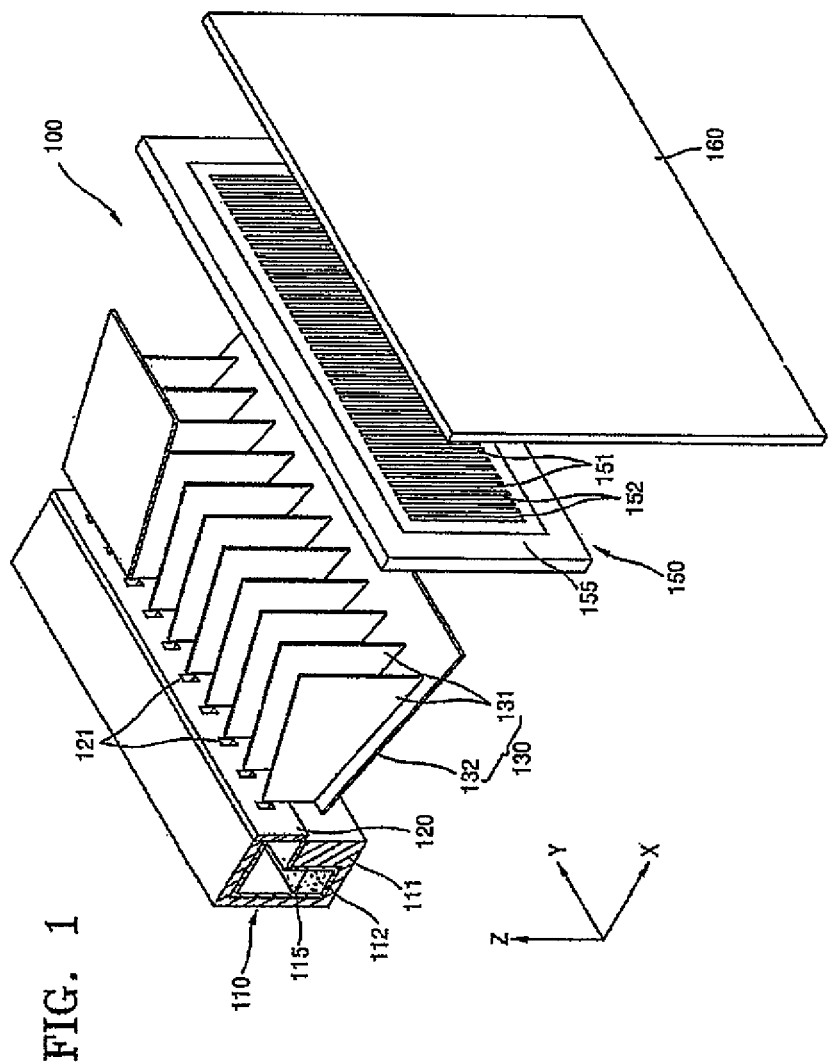
FIG. 1 is a schematic perspective view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
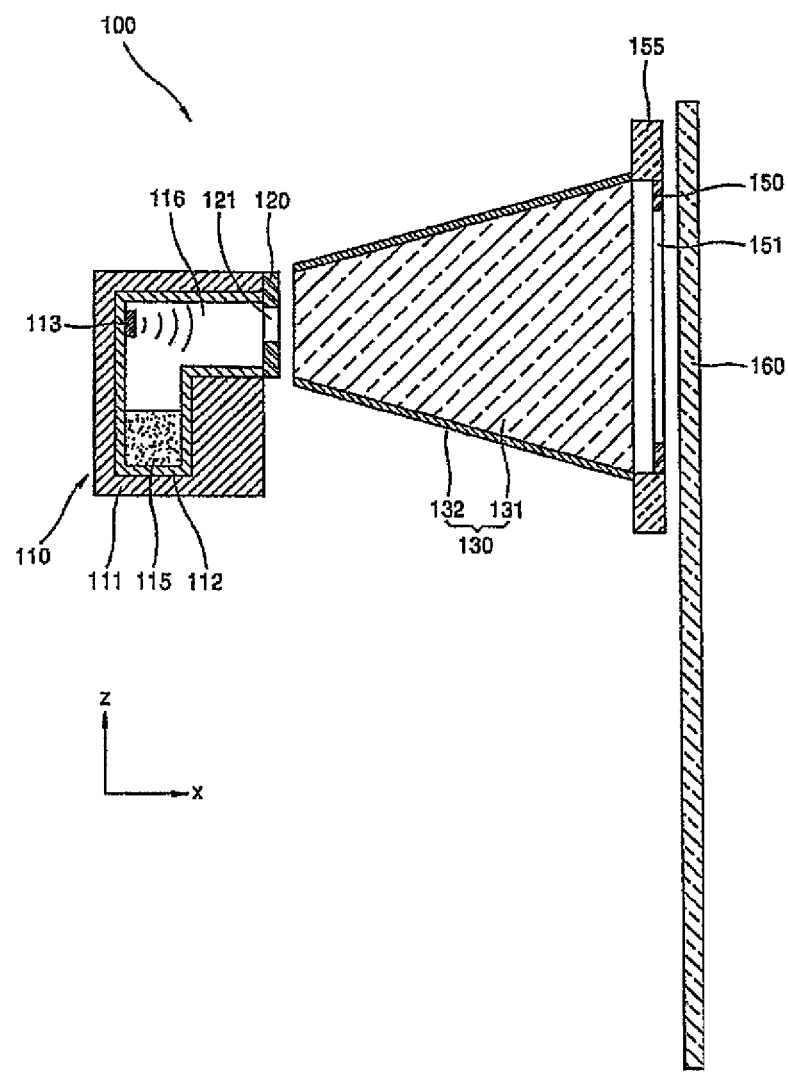
FIG. 2 is a schematic side view of the thin film deposition apparatus of FIG. 1.
Figure 3:
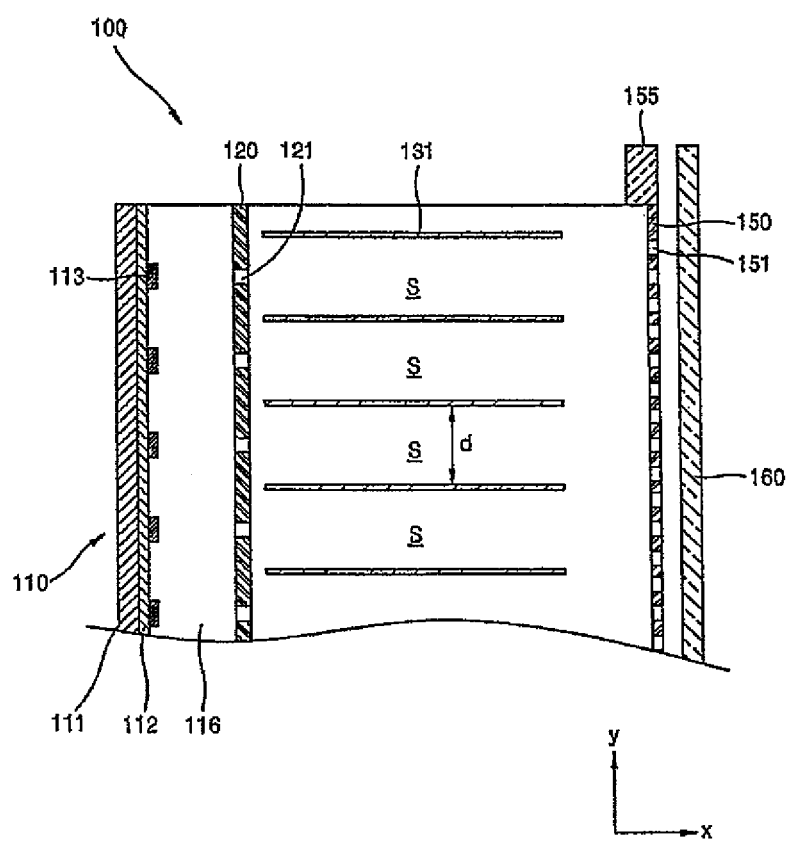
FIG. 3 is a schematic plan view of the thin film deposition apparatus of FIG. 1.

The aspects of the present invention will now be described more fully with reference to the accompanying drawings, in which exemplary embodiments of the invention are shown, FIG. 1 is a schematic perspective view of a thin film deposition apparatus 100 according to an embodiment of the present invention. FIG. 2 is a schematic side view of the thin film deposition apparatus 100. FIG. 3 is a schematic plan view of the thin film deposition apparatus 100.

Referring to FIGS. 1 to 3, the thin film deposition apparatus 100 includes a deposition source 110, a nozzle unit 120, a barrier plate assembly 130, and a patterning slit sheet 150.

Although a chamber is not illustrated in FIGS. 1 to 3 for convenience of explanation, all the components of the thin film deposition apparatus 100 illustrated in FIGS. 1 to 3 may be disposed within a chamber that is maintained at an appropriate degree of vacuum. The chamber is maintained at an appropriate vacuum in order to allow a deposition material to move in a substantially straight line through the thin film deposition apparatus 100.

The deposition source 110 that contains and heats a deposition material 115 is disposed in an opposite side of the chamber to the side in which a substrate 160 is disposed. As the deposition material 115 contained in the deposition source 110 is vaporized, the deposition material 115 is deposited on the substrate 160.

The deposition source 110 includes a crucible 111 that is filled with the deposition material 115, and a heater 112 that heats the crucible 111 to vaporize the deposition material 115 contained in the crucible 111 towards a side of the crucible 111, and in particular, towards the nozzle unit 120.

A plurality of piezo-oscillation plates 113 are disposed inside the deposition source 110. The piezo-oscillation plates 113 increase an emission coefficient of the vaporized deposition material 115 that is emitted toward the nozzle unit 120. This will be described later.

The nozzle unit 120 is disposed at a side of the deposition source 110, and in particular, at the side of the deposition source 110 facing the substrate 160. The first nozzle unit 120 includes a plurality of nozzle slits 121 that may be arranged at equal intervals along a first direction, e.g., a Y-axis direction. The deposition material 115 that is vaporized in the deposition source 110, passes through the plurality of nozzle slits 121 towards the substrate 160 on which the deposition material 115 is to be deposited.

The substrate 160 may be a substrate for flat panel displays. A large substrate, such as a mother glass, for manufacturing a plurality of flat panel displays, may be used as the substrate 160.

The patterning slit sheet 150 is disposed opposite to the nozzle unit 120 and includes a plurality of patterning slits 151 arranged in the first direction, i.e., the Y-axis direction. In detail, each of the patterning slits 151 is disposed between adjacent patterning ribs 152. The thin film deposition apparatus 100 may further include a frame 155 for supporting the patterning slit sheet 150, as illustrated in FIG. 1. The frame 155 may be formed in a lattice shape, similar to a window frame. The patterning slit sheet 150 is bound inside the frame 155. Each of the patterning slits 151 extends in a direction, e.g., a Z-axis direction in FIG. 1, intersecting the first direction.

The deposition material 115 that has been vaporized in the deposition source 111 and passed through the nozzle unit 120 passes through the patterning slits 151 towards the substrate 160, The patterning slit sheet 150 may be formed of a metal thin film. The patterning slit sheet 150 is fixed to the frame 155 such that a tensile force is exerted thereon. The patterning slits 151 may be formed by etching the patterning slit sheet 150 to a stripe pattern. The total number of the patterning slits 151 may be greater than the total number of nozzle slits 121 of the nozzle unit 112.

The barrier plate assembly 130 is disposed between the nozzle unit 120 and the patterning slit sheet 150 in the first direction, and includes a plurality of barrier plates 131 that partition a deposition space between the nozzle unit 120 and the patterning slit sheet 150 into a plurality of sub-deposition spaces S. In the thin film deposition apparatus 100 of the thin film deposition apparatus, the deposition space is divided by the barrier plates 131 into the sub-deposition spaces S that respectively correspond to the plurality of slits 121 through which the deposition material 115 is discharged, as illustrated in FIG. 3. The barrier plate assembly 130 may further include a barrier plate frame 132 that covers sides of the barrier plates 131, if needed, as illustrated in FIG. 1.

The plurality of barrier plates 131 may be arranged parallel to each other at equal intervals in the Y-axis direction. In addition, each of the barrier plates 131 may extend parallel to an XZ plane in FIG. 2, and may have a rectangular shape.

The barrier plates 131 may be respectively disposed between adjacent nozzle slits 121. in other words, each of the plurality of nozzle slits 121 may be disposed between two adjacent barrier plates 131. In particular, the plurality of nozzle slits 121 may be respectively located at the midpoint between two adjacent barrier plates 131, as illustrated in FIG, 1.

As described above, since the barrier plates 131 partition the deposition space between the nozzle unit 120 and the patterning slit sheet 150 into the plurality of sub-deposition spaces S, the deposition material 115 discharged through each of the plurality of nozzle slits 121 is not mixed with the deposition material 115 discharged through the other nozzle slits 121 and passes through the patterning slits 151 so as to be deposited on the substrate 160. In other words, the barrier plates 131 guide the deposition material 115, which is discharged through the plurality of nozzle slits 121, to move in a straight direction, i.e., in the X-axis direction.

As described above, the deposition material 115 is forced to move straight by installing the barrier plates 131, so that a smaller shadow zone may be formed on the substrate 160 than when no barrier plates are installed. Thus, the thin film deposition apparatus 100 and the substrate 160 may be separated from each other by a predetermined distance. This will be described later in detail.

The barrier plate frame 132, which covers sides of the barrier plates 131, maintains the positions of the barrier plates 131, and guides the deposition material 115, which is discharged through the plurality of slits 121, not to disperse in the Z-axis direction.

The nozzle unit 120 and the barrier plate assembly 130 may be separated from each other by a predetermined distance. This may prevent heat radiated from the deposition source 110 from being conducted to the barrier plate assembly 130. However, the present invention is not limited to this. If an appropriate heat insulator (not shown) is disposed between the nozzle unit 120 and the barrier plate assembly 130, the nozzle unit 120 and the barrier plate assembly 130 may be bound together with the heat insulator therebetween.

The thin film deposition apparatus 100 according to an embodiment of the present invention may perform deposition while moving relative to the substrate 160 along a direction (the Z-axis direction) intersecting the first direction (the Y-axis direction). That is, deposition is performed in a scanning manner while the thin film deposition apparatus 100 is moved along the Z-axis direction in FIG. 1. Although FIG. 2 illustrates that deposition is performed while the thin film deposition apparataus 100 is moved along the Z-axis direction, the present invention is not limited thereto and deposition may be performed while the substrate 160 is moved along the Z-axis direction, whereas the thin film deposition apparatus 100 is fixed.

Thus, in the thin film deposition apparatus 100, the patterning slit sheet 150 may be significantly smaller than an FMM used in a conventional deposition method. As described above, the patterning slit sheet 150 is manufactured to be smaller than the substrate 160 and is moved relative to the substrate 160 during deposition. Thus, it is no longer necessary to manufacture a large FMM used in the conventional deposition method. In addition, since the substrate 160 and the patterning slit sheet 150 are separated from each other, defects caused due to contact therebetween may be prevented. In addition, since it is unnecessary to contact the substrate 160 with the patterning slit sheet 150 during a manufacturing process, the manufacturing speed may be improved.

In addition, the barrier plate assembly 130 may be constructed to be detachable from the thin film deposition apparatus 100. In the thin film deposition apparatus 100, the deposition space is enclosed by using the barrier plate assembly 130, so that the deposition material 115 that remains undeposited is mostly deposited within the barrier plate assembly 130. Thus, since the barrier plate assembly 130 is constructed to be detachable from the thin film deposition apparatus 100, when a large amount of the deposition material 115 lies in the barrier plate assembly 130 after a long deposition process, the barrier plate assembly 130 may be detached from the thin film deposition apparatus 100 and then placed in a separate deposition material recycling apparatus In order to recover the deposition material 115. Owing to the structure of the thin film deposition apparatus 100, a reuse ratio of the deposition material 115 is increased, so that the deposition efficiency is improved and the manufacturing costs are reduced.

A deposition ratio (%) is important in regard to the thin film deposition apparatus 100. The deposition ratio is a ratio of the amount of a material that is actually deposited on the substrate 160 to the total amount of vaporized material from the deposition source 100. In the thin film deposition apparatus 100, the deposition ratio may be increased by increasing the distances d between adjacent barrier plates 131 or increasing an emission coefficient n of the deposition source 110. However, in the case of the thin film deposition apparatus 100, the greater the distances d between adjacent barrier plates 131, the more difficult it is to precisely form a pattern on the substrate 160. Thus, a structure of the thin film deposition apparatus 100, in which a plurality of emission coefficient Increasing units are included in the deposition source 110 in order to improve the deposition ratio, according to another embodiment of the present invention, will now be described.

Since a predetermined pressure is applied to the inside of the deposition source 110 and intermolecular collisions occur very often inside the deposition source 110, it is difficult to control a direction of molecular motion of a vaporized deposition material. If the direction of the molecular motion may be changed toward a mouth of the nozzle unit 120 via which the vaporized material is discharged, then the emission coefficient n may be increased. That is, even if molecular motion occurs randomly in the deposition source 110, it is possible to achieve a desired effect by adding a predetermined quantity of motion to the mouth of the deposition source 110.

Figure 4A:
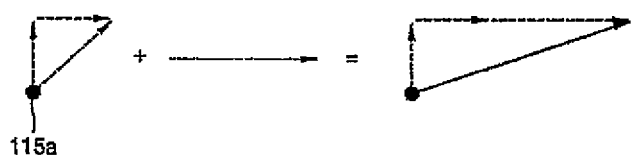
FIGS. 4A-4C are conceptual diagrams illustrating molecular motion of a vaporized gas.
Figure 4B:
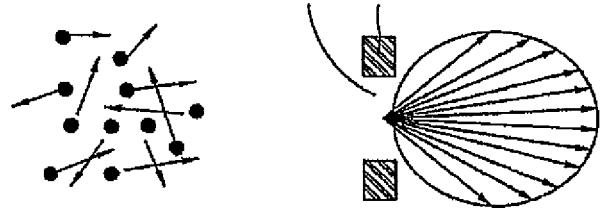
Figure 4C:
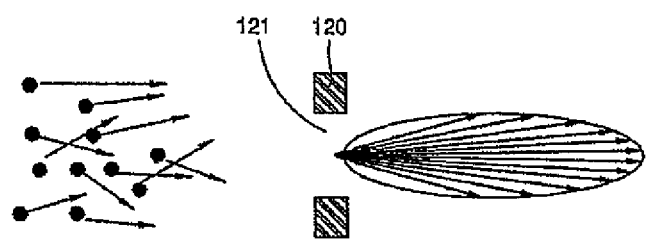

FIGS. 4A-4C are conceptual diagrams illustrating molecular motion of a vaporized gas 115a. Referring to FIG. 4A, the quantity of molecular motion is illustrated using a vector, in which when a vector representing a motion toward the right is added to the original vector, the original vector extends toward the right. FIG. 4B is a conceptual diagram illustrating random motion of the vaporized gas 115a in the deposition source 110. If a motion toward the right as illustrated in FIG. 4A, i.e., toward the nozzle slits 121, is added to the random motion of the vaporized gas 115a illustrated in FIG. 4B, then the vaporized gas 115a is discharged in the form illustrated in FIG. 4C. That is, the emission coefficient n of the deposition material 115 may be increased by increasing the quantity of motion of the deposition material 115 toward the nozzle slits 121, so that the amount of the deposition material 115 deposited on the barrier plates 131 may be reduced and the amount of the deposition material 115 deposited on the substrate 160 may be increased.

To this end, the thin film deposition apparatus 100 includes the plurality of piezo-oscillation plates 113 as a plurality of emission coefficient increasing units toward the nozzle unit 120 inside the deposition source 110. The piezo-oscillation plates 113 increase the emission coefficient n of the deposition material 115 that is emitted toward the nozzle unit 120. The pizeo-oscillation plates 113 may be disposed at locations corresponding to the plurality of nozzle slits 121 of the nozzle unit 120, respectively. Also, the piezo-oscillation plates 113 may be disposed in such a manner that oscillation surfaces thereof face the nozzle unit 120 and the central axis of oscillation of each of the piezo-oscillation plates 113 substantially coincides with the center of the corresponding nozzle slit 121. The piezo-oscillation plates 113 may oscillate at a speed of about 0.2 to 4 times the speed of molecular motion of the heated deposition material 115.

Since the oscillation surfaces of the respective piezo-oscillation plates 113 face the nozzle slits 121, the emission coefficient n may be increased by adding the quantity of motion of a vaporized material, which moves in random directions within a vaporization space 116, toward the nozzle slits 121, so that the amount of the deposition material 115 deposited on the barrier plates 131 may be reduced and the amount of the deposition material 115 deposited on the substrate 160 is increased. Accordingly, the deposition ratio is improved.

Figure 5:
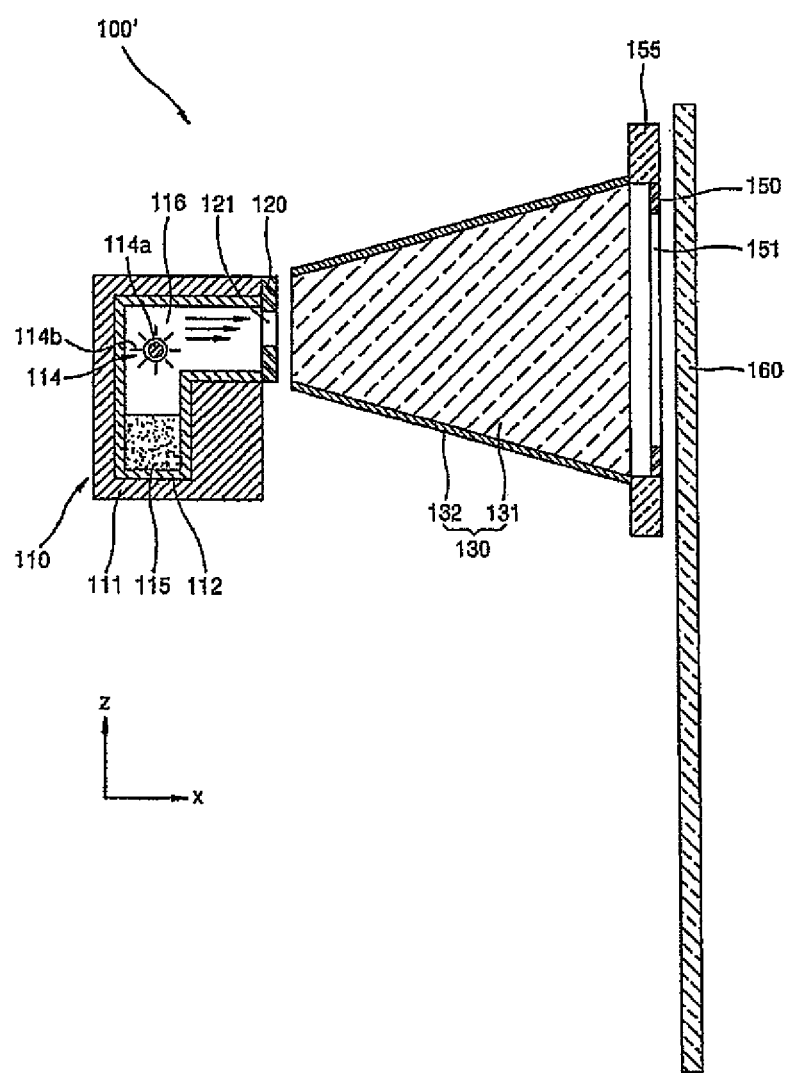
FIG. 5 is a schematic cross-sectional view of a thin film deposition apparatus according to another embodiment of the present invention.

FIG. 5 is a schematic cross-sectional view of a thin film deposition apparatus 100' according to another embodiment of the present invention.

The thin film deposition apparatus 100' is the same as the thin film deposition apparatus 100 except that a super-high speed rotary wing assembly 114 is included as an emission coefficient increasing unit in a deposition source 110. Therefore, the thin film deposition apparatus 100' will now be described focusing on the difference.

A rotation axis 114a of the super-high speed rotary wing assembly 114 is disposed parallel to a direction (a Y-axis direction) along which a nozzle unit 120 extends and perpendicular to a first direction (an X-axis direction) toward which a deposition source 110 faces a substrate 160. If the super-high speed rotary wing assembly 114 rotates clockwise with respect to the rotation axis 114a, then a wing unit 114b of the super-high speed rotary wing assembly 114 rotates thus generating air currents clockwise within the vaporization space 116. For example, if the super-high speed rotary wing assembly 114 rotates at a speed of about 800,000 rpm, then the wing unit 114b may generate air currents at a speed of 100 to 800 m/sec or more enough to move the vaporized material toward a specific direction. From among the air currents generated by the wing unit 114b, an air current toward the nozzle unit 120 moves in random directions within the vaporization space 116 and increases the quantity of motion of the vaporized material, which moves in random directions, toward the nozzle slits 121. Thus, the emission coefficient n may be increased by reducing the amount of the deposition material 115 deposited on the barrier plates 131 and increasing the amount of the deposition material 115 deposited on the substrate 160. Therefore, the deposition ratio is improved.

Figure 6:
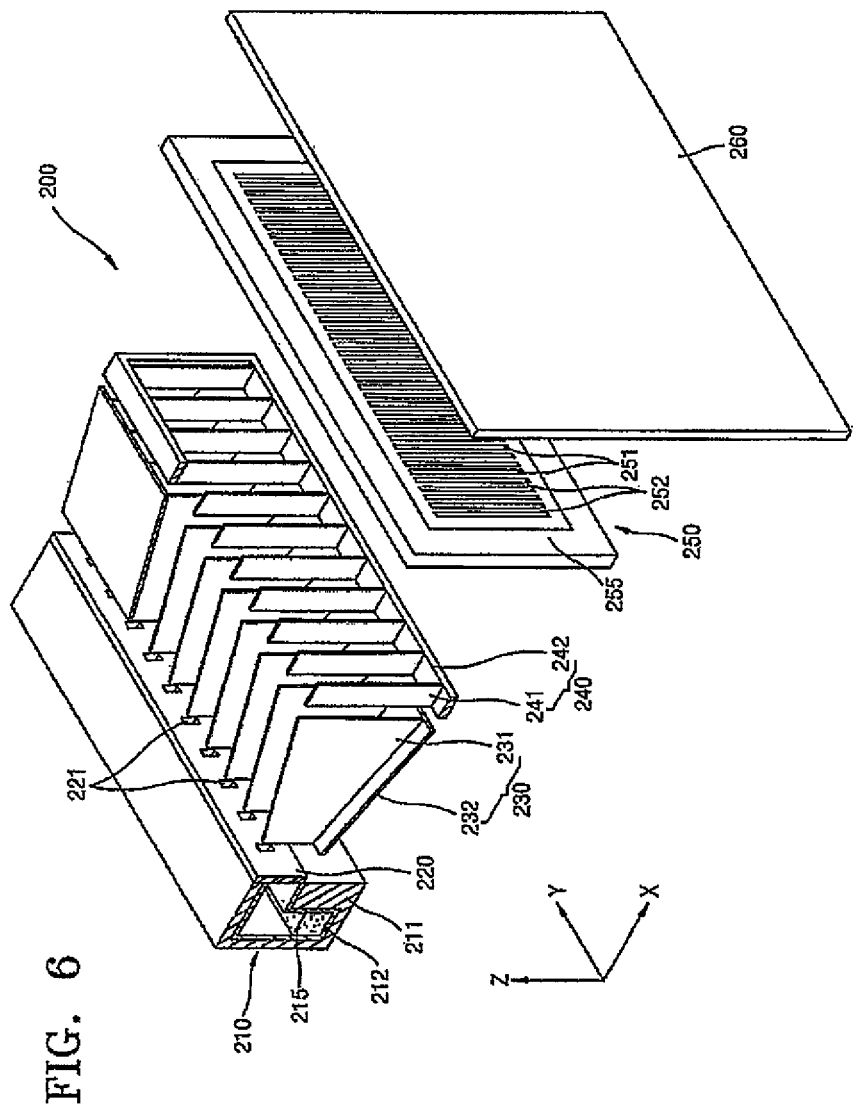
FIG. 6 is a schematic perspective view of a thin film deposition apparatus according to another embodiment of the present invention.

FIG. 6 is a schematic perspective view of a thin film deposition apparatus 200 according to another embodiment of the present invention. Referring to FIG. 6, the thin film deposition assembly 200 includes a deposition source 210, a nozzle unit 220, a first barrier plate assembly 230, a second barrier plate assembly 240, and a patterning slit sheet 250.

Although a chamber is not illustrated in FIG. 6 for convenience of explanation, all the components of the thin film deposition assembly 200 may be disposed within a chamber that is maintained at an appropriate degree of vacuum. The chamber is maintained at an appropriate vacuum in order to allow a deposition material 215 to move in a substantially straight line through the thin film deposition apparatus 200. A substrate 260, which constitutes a target on which the deposition material 215 is to be deposited, is disposed in the chamber. The deposition source 210 that contains and heats the deposition material 215 is disposed in an opposite side of the chamber to that in which the substrate 260 is disposed.

Although not shown, in the deposition source 210, a piezo-oscillation plate or a super-high speed rotary wing assembly may be included as an emission coefficient increasing unit toward the nozzle unit 220, similar to the embodiments of FIGS. 2 and 5.

The patterning sleet sheet 250 includes a plurality of patterning slits 251 that are the same as the patterning sleet sheet 150 illustrated in FIG. 1.

The first barrier plate assembly 230 is the same as the barrier plate assembly 130 of FIG. 1.

The second barrier plate assembly 240 is disposed at a side of the first barrier plate assembly 230. The second barrier plate assembly 240 includes a plurality of second barrier plates 241, and a second barrier plate frame 242 that covers sides of the second barrier plates 241.

The plurality of second barrier plates 241 may be arranged parallel to each other at equal intervals in the Y-axis direction. In addition, each of the second barrier plates 241 may be formed to extend along an XZ plane in FIG. 6, i.e., perpendicular to the Y-axis direction.

The plurality of first barrier plates 231 and second barrier plates 241 arranged as described above partition the space between the nozzle unit 220 and the patterning slit sheet 250. That is, a deposition space is partitioned into a plurality of sub deposition spaces corresponding to respective nozzle slits 221 of the nozzle unit 220, via which the deposition material is discharged, respectively, by the plurality of first barrier plates 231 and second barrier plates 241.

The second barrier plates 241 may be disposed to correspond to the first barrier plates 231, respectively. in other words, the second barrier plates 241 may be disposed to be parallel to the first barrier plates 231, respectively. That is, each pair of the corresponding first and second barrier plates 231 and 241 may be located on the same plane. The width of the first barrier plates 231 may be equal to or be different from the width of the second barrier plate 241 in the X-axis direction. In other words, the second barrier plates 241, which need to be accurately aligned with the patterning slits 251, may be formed to be relatively thin, whereas the first barrier plates 231, which do not need to be precisely aligned with the patterning slits 251, may be formed to be relatively thick. This makes it easier to manufacture the thin film deposition apparatus 200.

Figure 7:
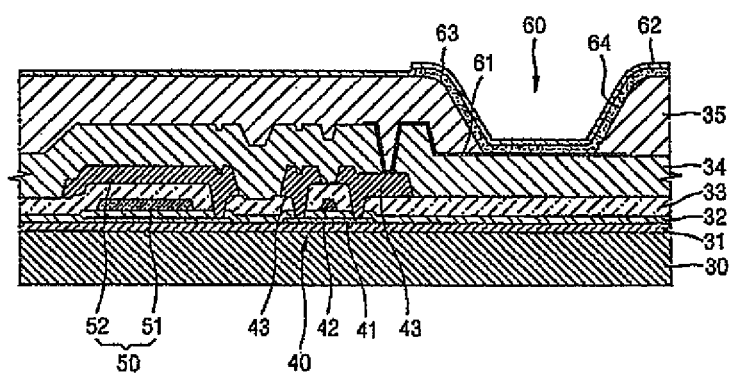
FIG. 7 is a schematic cross-sectional view of an active matrix organic light-emitting display device manufactured by using a thin film deposition apparatus, according to an embodiment of the present invention.

FIG. 7 is a schematic cross-sectional view of an active matrix organic light-emitting display device manufactured by using the thin film deposition apparatus 100, 100', or 200, according to an embodiment of the present invention.

Referring to FIG. 7, the active matrix organic light-emitting display device is disposed on a substrate 30. The substrate 30 may be formed of a transparent material, for example, glass, plastic, or metal. An insulating layer 31, such as a buffer layer, is formed on an entire surface of the substrate 30.

A thin film transistor (TFT) 40, a capacitor 50, and an organic light-emitting diode (OLED) 60 are disposed on the insulating layer 31, as illustrated in FIG. 7.

An active layer 41 is formed on an upper surface of the insulating layer 31 in a predetermined pattern. A gate insulating layer 32 is formed to cover the active layer 41. The active layer 41 may be a p-type or n-type semiconductor layer.

A gate electrode 42 of the TFT 40 is formed in a region of the gate insulating layer 32 corresponding to the active layer 41. An interlayer insulating layer 33 is formed to cover the gate electrode 42. Then, the gate insulating layer 32 and the interlayer insulating layer 33 are etched by, for example, dry etching, to form a contact hole for exposing parts of the semiconductor active layer 41.

A source/drain electrode 43 is formed on the interlayer insulating layer 33 to contact the active layer 41 through the contact hole. A passivation layer 34 is formed to cover the source/drain electrode 43, and is etched to expose a part of the drain electrode 43. An insulating layer (not shown) may further be formed on the passivation layer 34 so as to planarize the passivation layer 34.

The OLED 60 displays predetermined image information by emitting red, green, or blue light as current flows. The OLED 60 includes a first electrode 61, an organic emission layer 63, and a second electrode 62.

First, the first electrode 61 is formed on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and the organic emission layer 63 is formed in a region defined by the opening 64. The second electrode 62 is formed on the organic emission layer 63.

The pixel defining layer 35, which defines individual pixels, is formed of an organic material. The pixel defining layer 35 also planarizes the surface of a region where the first electrode 61 is formed, and in particular, the surface of the passivation layer 34.

The first electrode 61 and the second electrode 62 are insulated from each other, and respectively apply voltages having opposite polarities to the organic emission layer 63 to induce light emission.

The organic emission layer 63 may be formed of a low-molecular weight or high-molecular weight organic material. When a low-molecular weight organic material is used, the organic emission layer 63 may have a single or multi-layer structure including at least one selected from the group consisting of a hole injection layer (HIL), a hole transport layer (HTL), an emission layer (EML), an electron transport layer (ETL), an electron injection layer (EIL), etc. Examples of available organic materials may include copper phthalocyanine (CuPc), N,N'-di(naphthalene-1-yl)-N,N'-diphenyl-benzidine (NPS), tris-8-hydroxyquinoline aluminum (Alq3), etc. Such a low-molecular weight organic material may be formed by vacuum deposition using one of the deposition source 110 of FIG. 1 or a thin film deposition apparatus, such as those described above with reference to FIGS. 2 through 6.

Once the opening 64 has been formed in the pixel defining layer 35, the substrate 30 is transferred to a chamber (not shown). Next, the organic emission layer 63 is formed by containing a target organic material in a crucible of a deposition source and depositing the target organic material in the region defined by the opening 64.

After the organic emission layer 63 is formed, the second electrode 62 may be formed by the same deposition method as used to form the organic emission layer 63.

The first electrode 61 may function as an anode and the second electrode 62 may function as a cathode. Alternatively, the first electrode 61 may function as a cathode and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of an indium tin oxide (ITO), an indium zinc oxide (IZO), a zinc oxide (ZnO), or an indium oxide ($In_2O_3$). Such a reflective electrode may be formed by forming a reflective Layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. Such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on the organic emission layer 63 and forming an auxiliary electrode layer or a bus electrode line thereon from ITO, IZO, ZnO, $In_2O_3$, or the like. When the second electrode 62 is formed as a reflective electrode, the reflective electrode may be formed by depositing Li, Ca, LiF/Ca, LiF/Al, Al, Ag, Mg, or a compound thereof on the entire surface of the organic emission layer 63. The second electrode 62 may be formed by using the same deposition method as used to form the organic emission layer 63 described above.

The thin film deposition apparatuses according to the above embodiments of the present invention described above may be used to form a passive matrix organic light-emitting display device or an organic or inorganic layer of an organic TFT, and to form layers from various materials.

A thin film deposition apparatus and a method of fabricating the same according to an embodiment of the present invention can be simply applied to manufacture large substrates on a mass scale and can improve the ratio of material utilization and the deposition ratio.

While the present invention has been particularly shown and described with reference to exemplary embodiments thereof, it will be understood by those of ordinary skill in the art that various changes in form and details may be made therein without departing from the spirit and scope of the present invention as defined by the following claims.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film deposition apparatus comprising:
   a deposition source comprising a crucible to contain a deposition material and a heater to heat and vaporize the deposition material;
   a nozzle unit disposed at a side of the deposition source extending in a first direction and comprising a plurality of nozzle slits to discharge the vaporized deposition material;
   a plurality of emission coefficient increasing units comprising a super-high speed rotary wing assembly, the emission coefficient increasing units being located within the crucible and facing the nozzle unit and configured to increase motion of the vaporized deposition material toward the nozzle unit;
   a patterning slit sheet opposite to the nozzle unit and comprising a plurality of patterning slits arranged along the first direction; and
   a barrier plate assembly between the nozzle unit and the patterning slit sheet, the barrier plate assembly comprising a plurality of barrier plates arranged along the first direction and partitioning a space between the nozzle unit and the patterning slit sheet into a plurality of sub-deposition spaces,
   wherein each of the plurality of super-high speed rotary wing assemblies is arranged to directly face a corresponding one of the plurality of nozzle slits arranged along the first direction.

2. The thin film deposition apparatus of claim 1, wherein a rotation axis of the super-high speed rotary wing assembly is parallel to the first direction of the nozzle unit and perpendicular to a direction toward the nozzle unit.

3. The thin film deposition apparatus of claim 1, wherein a speed of rotation of the super-high speed rotary wing assembly is about 0.2 to 4 times a speed of molecular motion of the heated deposition material.

4. The thin film deposition apparatus of claim 1, wherein the plurality of barrier plates are arranged at equal intervals.

5. The thin film deposition apparatus of claim 1, wherein the plurality of barrier plates are spaced from the patterning slit sheet.

6. The thin film deposition apparatus of claim 1, wherein the barrier plate assembly comprises a first barrier plate assembly including a plurality of first barrier plates, and a second barrier plate assembly including a plurality of second barrier plates.

7. The thin film deposition apparatus of claim 6, wherein the plurality of first and second barrier plates extend along a second direction substantially perpendicular to the first direction and partition the space between the nozzle unit and the patterning slit sheet into the plurality of sub-deposition spaces.

8. The thin film deposition apparatus of claim 6, wherein the first barrier plates are arranged to correspond to the second barrier plates, respectively.

9. The thin film deposition apparatus of claim 8, wherein each pair of the corresponding first and second barrier plates is arranged on substantially a same plane.

* * * * *